US012055801B2

(12) United States Patent
Colombelli et al.

(10) Patent No.: US 12,055,801 B2
(45) Date of Patent: Aug. 6, 2024

(54) ULTRA-FAST MODULATOR FOR MODULATING THE AMPLITUDE OF LASER RADIATION

(71) Applicants: Centre National De La Recherche Scientifique, Paris (FR); UNIVERSITE PARIS-SACLAY, Gif-sur-Yvette (FR)

(72) Inventors: Raffaele Colombelli, Vincennes (FR); Stefano Pirotta, Paris (FR); Ngoc Linh Tran, Palaiseau (FR)

(73) Assignees: CENTRE NATIONAL DE LA RECHERCHE SCIENTIFIQUE, Paris (FR); UNIVERSITE PARIS SACLAY, Gif-sur-Yvette (FR)

( * ) Notice: Subject to any disclaimer, the term of this patent is extended or adjusted under 35 U.S.C. 154(b) by 425 days.

(21) Appl. No.: 17/598,632

(22) PCT Filed: Mar. 27, 2020

(86) PCT No.: PCT/EP2020/058841
§ 371 (c)(1),
(2) Date: Sep. 27, 2021

(87) PCT Pub. No.: WO2020/193786
PCT Pub. Date: Oct. 1, 2020

(65) Prior Publication Data
US 2022/0187634 A1    Jun. 16, 2022

(30) Foreign Application Priority Data
Mar. 27, 2019 (FR) ........................ 1903211

(51) Int. Cl.
*G02F 1/017* (2006.01)
*H01L 33/04* (2010.01)

(52) U.S. Cl.
CPC .......... *G02F 1/01716* (2013.01); *H01L 33/04* (2013.01)

(58) Field of Classification Search
CPC ............................ G02F 1/01716; H01L 33/04
See application file for complete search history.

(56) References Cited

U.S. PATENT DOCUMENTS

| 9,748,736 B1 * | 8/2017 | Ma ........................ H01S 5/1046 |
| 10,353,269 B2 * | 7/2019 | Rodriguez ............ G02F 1/3551 |

(Continued)

FOREIGN PATENT DOCUMENTS

| JP | 2-2507 A | 1/1990 |
| JP | 9-172227 A | 6/1997 |
| WO | 2015/129668 A1 | 9/2015 |

OTHER PUBLICATIONS

Ciuti, Cristiano, et al., "Quantum vacuum properties of the intersubband cavity polariton field", arxiv.org, Feb. 2, 2008, (preprinted Apr. 2005), 10 pages, Cornell University Library, US.

(Continued)

*Primary Examiner* — Mark W Tornow
(74) *Attorney, Agent, or Firm* — BakerHostetler

(57) ABSTRACT

A device for modulating the amplitude of an incident laser radiation of wavelength $\lambda_i$ is provided. The device includes a metal bottom layer above which there is a semiconductive layer contains a stack of a plurality of quantum wells above which there is a structured metal top layer, the two metal layers being reflective to the incident laser radiation, the structuring of the top layer and the distance between said two metal layers being small enough for the device to form an optical microcavity having at least one resonance mode; at least a part of the quantum wells, called active wells, having an intersubband absorption at a central wavelength $\lambda_{ISB}=hc/E_{ISB}$, the coupling between said intersubband transition at said central wavelength $\lambda_{ISB}$ and one of the modes (Continued)

Figure 1:
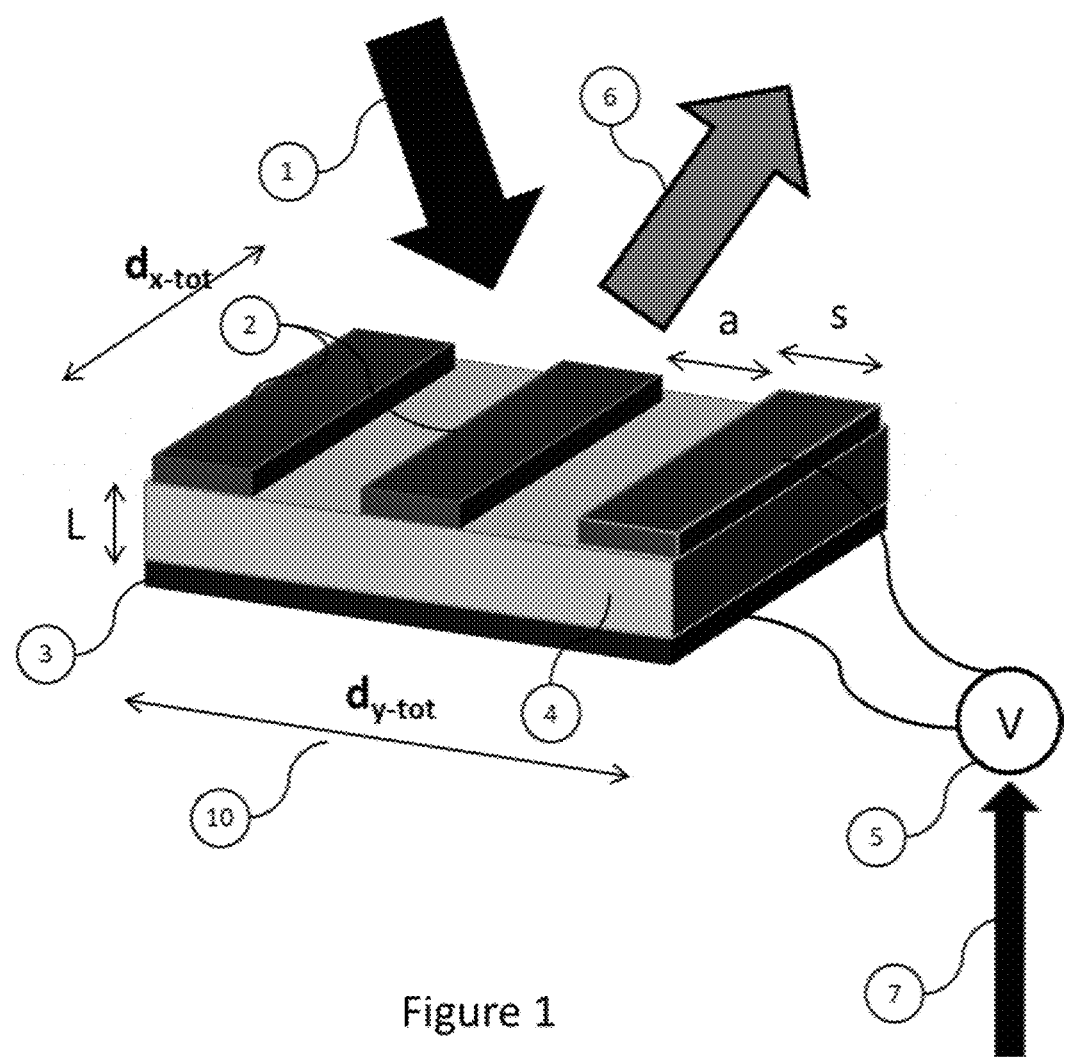

of the microcavity driving the excitation of cavity polaritons and a Rabi splitting at the energies $E_{ISB} \pm \hbar\Omega_{Rabi}$ with $\Omega_{Rabi}$ the Rabi frequency; said device including an electric circuit configured to apply two distinct voltage differences, $V_0$ and $V_1$, between the two metal layers, the device absorbing the incident radiation for the voltage difference $V_0$ and the device reflecting or transmitting the incident radiation for the voltage difference $V_1$.

18 Claims, 7 Drawing Sheets

(56) References Cited

U.S. PATENT DOCUMENTS

| | | | |
|---|---|---|---|
| 2007/0007507 A1* | 1/2007 | Deveaud-Pledran | ........................ H01S 5/18327 257/14 |
| 2009/0097510 A1* | 4/2009 | Tignon | ...................... G02F 1/39 372/21 |
| 2018/0196138 A1 | 7/2018 | Lee et al. | |

OTHER PUBLICATIONS

De Liberato, Simone, et al., "Quantum Vacuum Radiation Spectra from a Semiconductor Microcavity with a Time-Modulated Vacuum Rabi Frequency", Physical Review Letters, Mar. 8, 2007, pp. 103602-1-103602-4, vol. 98, No. 10, The American Physical Society, US.

Dini, Dimitri et al., "Microcavity Polariton Splitting of Intersubband Transitions", Physical Review Letters, Mar. 18, 2003, pp. 116401-1-11640-4, vol. 90, No. 11, American Physical Society, US.

International Searching Authority, International Search Report (ISR) and Written Opinion received for International Application No. PCT/EP2020/058841, dated Apr. 29, 2020, 12 pages, European Patent Office, Netherlands.

Machhadani, H., et al., "GaN/AlGaN intersubband optoelectronic devices", New Journal of Physics, Dec. 17, 2009, 16 pages, vol. 11, No. 125023, IOP Publishing Ltd., UK.

National Industrial Property Institute, Preliminary Search Report and Written Opinion received for Application No. FR1903211, dated Jan. 23, 2020, 7 pages, Republic of France.

Nevou, Laurent, et al., "Short-wavelength intersubband electro-absorption modulation based on electron tunneling between GaN/AlN coupled quantum wells", Applied Physics Letters, May 2007, pp. 223511-1-223511-3, vol. 90, No. 22, retrieved from the Internet at <URL: https://www.researchgate.net/publication/232607154 Short-wavelength_intersubband_electro-absorption_modulation_based_on_electron_tunneling_between_GaNAlN_coupled_quantum_wells/link/00463522b5411c6e90000000/download> on Sep. 24, 2021.

Wolf, Omri, et al., "Spectral filtering using active metasurfaces compatible with narrow bandgap III-V infrared detectors", Optics Express, Sep. 7, 2016, pp. 21512-21520, vol. 24, No. 19, Optical Society of America, US.

Lee, Jongwon, et al., "Ultrafast Electrically Tunable Polaritonic Metasurfaces", Advanced Optical Materials, Jul. 30, 2014, pp. 1057-1063, vol. 2, No. 11, Wiley-VCH Verlag GmbH & Co., KGaA, Germany.

* cited by examiner

ULTRA-FAST MODULATOR FOR MODULATING THE AMPLITUDE OF LASER RADIATION

CROSS-REFERENCE TO RELATED APPLICATIONS

This application is a national phase entry of PCT/EP2020/058841, filed on Mar. 27, 2020, which claims the benefit of priority of French Patent Application No. 1903211, filed on Mar. 27, 2019, the contents of which being hereby incorporated by reference in their entirety for all purposes.

FIELD

The invention relates to the field of electro-optical modulation and, more particularly, electro-optical modulators, notably in the infrared.

BACKGROUND

Ultra-fast modulation of the amplitude of a laser radiation in the mid infrared is an area of study eliciting a strong interest, particularly in the field of telecommunications for the transmission of information using an optical carrier. In fact, with an optical carrier having a wavelength within one of the two atmospheric windows (3-5 µm and 8-12 µm), the Mie theory demonstrates a strong robustness to the transmission of information in air with respect to atmospheric disturbances (water vapor, atmospheric particles, etc.). This robustness is due to the fact that the average size of the atmospheric particles is generally very much less than the wavelength of the carrier.

A second area of interest is metrology and high-resolution spectroscopy, because an ultra-fast modulation makes it possible to generate sidebands that are precisely positioned in frequency with respect to the frequency of the carrier.

Currently, the lasers in the mid-IR are, for the most part, quantum cascade lasers. However, within this wavelength range, there is no feed that can be modulated at high frequency (sub-GHZ and beyond) that is commercially available. Those rare solutions that are available and proposed in the scientific literature are still at the complex and costly demonstrator stage, very greatly limiting their uses and applications.

From the prior art, it is known practice to produce ultra-fast electro-optical modulators in the mid-IR that rely on the charge transfer between two coupled quantum wells (Nevou, L., et al. (2007). *Short-wavelength intersubband electroabsorption modulation based on electron tunneling between GaN/AlN coupled quantum wells. Applied Physics Letters*, 90(22), 223511). In this device, GaN quantum wells are coupled by an ultra-thin potential barrier made of AlN. One well serves as reservoir and another, the active well, is designed to exhibit an intersubband (ISB) transition at the illumination wavelength. Under the application of a positive voltage, the electrons are transferred by tunnel effect from the reservoir well to the active well and the modulator then becomes absorbent. It becomes transparent again by applying a negative voltage which provokes the return of the electrons into the reservoir well. The charge transfer mechanism is fast (a few picoseconds), so the device makes it possible to obtain a good response time (a few GHz), but, however, it allows only for a low modulation depth (approximately 30% at $\lambda$=2.1 µm).

It is also known practice to produce modulators in the mid-IR that are ultra-fast that rely on the population/depopulation of the quantum wells under the action of an electrical field (Machhadani, H., et al, (2009). *GaN/AlGaN intersubband optoelectronic devices. New Journal of Physics*, 11(12), 125023). By inserting an active region composed of three GaN/AlN quantum wells in a waveguide made of AlGaN, a modulation depth at 1.55 µm of 13.5 dB with a voltage of ±7 V has been demonstrated. In this type of device, the response frequency is limited only by the RC constant of the electric circuit applying a gate voltage that makes it possible to empty the quantum wells. In fact, the other phenomenon limiting the response time is the charge transfer between the coupled quantum wells, which is very fast because it is produced by tunnel effect (of the order of a few picoseconds). However, this device introduces significant propagation losses into the waveguide.

Finally, it is known practice to the person skilled in the art to produce an electro-optical modulator based on stacks of quantum wells placed in a microcavity, the quantum wells being constructed so as to exhibit a significant contained quantum Stark effect (Lee, J., et al. (2014). *Ultrafast Electrically Tunable Polaritonic Metasurfaces. Advanced Optical Materials*, 2(11), 1057-1063). In this device, the modulation is produced by the application of an electric field between the two elements of the microcavity and through the stack of quantum wells making it possible to displace the ISB absorption peaks by contained quantum Stark effect. Here too, the response time of such a device is limited only by the RC constant of the electric circuit. However, the modulation depth remains low (30% for $\lambda$=7.12 µm).

The invention aims to mitigate certain problems from the prior art. To this end, one subject of the invention is an electro-optical modulator based on stacks of quantum wells placed in a microcavity using the strong coupling regime in order to obtain a good response time of the device and an excellent modulation depth.

BRIEF SUMMARY

To that end, one subject of the invention is a device for modulating the amplitude of an incident laser radiation (1) of wavelength $\lambda_i$, characterized in that it comprises: a metal bottom layer (3) above which there is a semiconductive layer (4) contains a stack of a plurality of quantum wells, above which there is a structured metal top layer (2), the two metal layers (2, 3) being reflective to the incident laser radiation (1), the structuring of the top layer and the distance between said two metal layers L being small enough for the device to form an optical microcavity having at least one resonance mode; at least a part of the quantum wells, called active wells, having an intersubband absorption at a central wavelength $\lambda_{ISB}$=hc/$E_{ISB}$, the coupling between said intersubband transition at said central wavelength $\lambda_{ISB}$ and one of the modes of the microcavity driving the excitation of cavity polaritons and a Rabi splitting at the energies $E_{ISB} \pm \hbar\Omega_{Rabi}$ with $\Omega_{Rabi}$ the Rabi frequency; said device comprising an electric circuit (5) configured to apply two distinct voltage differences, $V_0$ and $V_1$ between the two metal layers, the device (4) absorbing the incident radiation (1) for the voltage difference $V_0$ and the device reflecting or transmitting the incident radiation for the voltage difference $V_1$.

According to particular embodiments of the invention:
the metal bottom layer does not have discontinuities and the device reflects the incident radiation for the voltage difference $V_1$;
the metal top layer is formed by a plurality of metal strips of width s, separated by a distance a, with s+a<$\lambda_i$/2;

the width of the metal strips s is such that $s=\lambda_r/2 \cdot n$ to ±30% with n the index of said semiconductive layer;

which the width of the metal strips $s=\lambda_r/2 \cdot ns$ is such that $s=3 \cdot \lambda_r/2 \cdot n$ to ±30% with n the index of said semiconductive layer;

the contacts between the semiconductive layer and the metal layers are produced by Schottky contacts or by the introduction of insulating layers;

the distance between said two metal layers L is equal to $\lambda_r/30$ to ±30%;

the distance between the two metal layers L is chosen by digital simulations so that said device operates in non-dispersive regime;

the quantum wells or the barriers separating the quantum wells are electronically doped, the quantum wells being chosen so that, for a first voltage difference $V_0$ applied by said electric circuit (5) between said two metal layers, the device exhibits an absorption to the energies $E_{ISB} \pm \hbar_{Rabi}$ and not to the wavelengths equal to the resonance modes of the cavity and so that, for a second voltage difference $V_1$, all the quantum wells of the semiconductive layer are depopulated of their charges, the device exhibits an absorption to the cavity resonance modes and not to the energies $E_{ISB} \pm \hbar \Omega_{Rabi}$;

the thickness of the semiconductive layer L is such that $V_1$ is less than the maximum voltage supported by the contacts between the semiconductive layer and the metal layers;

the thickness L of the semiconductive layer is chosen so that $V_1$ is less than 10 V;

the distance between said two metal layers L is equal to $\lambda_r/10$ to ±30%;

the semiconductive layer comprises a stack of coupled quantum wells composed of a non-doped narrow well, called active well, separated by a first barrier from a wide well, called reservoir, the coupled quantum wells being separated from one another on another side a second barrier wider than said first barrier, the first barrier or the reservoir of each coupled quantum well being electronically doped, the active wells being chosen in order for them to exhibit an intersubband absorption at a central wavelength $\lambda_{ISB}$ close to a resonance mode of said optical microcavity;

said coupled quantum wells being adapted so that, for a first voltage difference $V_0$ applied by said electric circuit (5) between said two metal layers, the charges originating from the doping are transferred by tunnel effect into the narrow wells and the device exhibits an absorption to the energies $E_{ISB} \pm \hbar \Omega_{Rabi}$ and not to the wavelengths equal to the resonance modes of the cavity, and so that, for a second voltage difference $V_1$, the device exhibits an absorption to the wavelengths equal to the resonance modes of the cavity and not to the energies $E_{ISB} \pm \hbar \Omega_{Rabi}$;

the thickness L of the semiconductive layer is chosen so that $V_0$ is less than or equal to 2 V;

the semiconductive layer is structured so that the stacks of quantum wells are situated only directly below the metal strips of the metal top layer;

the quantum wells of the semiconductive layer are produced in GaAs/AlGaAs; InGaAs/AlInAs; InAs/AlSb, Si/SiGe, GaN/AlGaN;

the characteristic dimension is less than 200 μm;

the metal bottom layer has discontinuities and is structured so that said device transmits the incident radiation for the voltage difference $V_1$, said device comprising a substrate 8 that is transparent to the incident radiation below the metal bottom layer and in contact therewith.

BRIEF DESCRIPTION OF THE SEVERAL VIEWS OF THE DRAWING(S)

Figure 2:
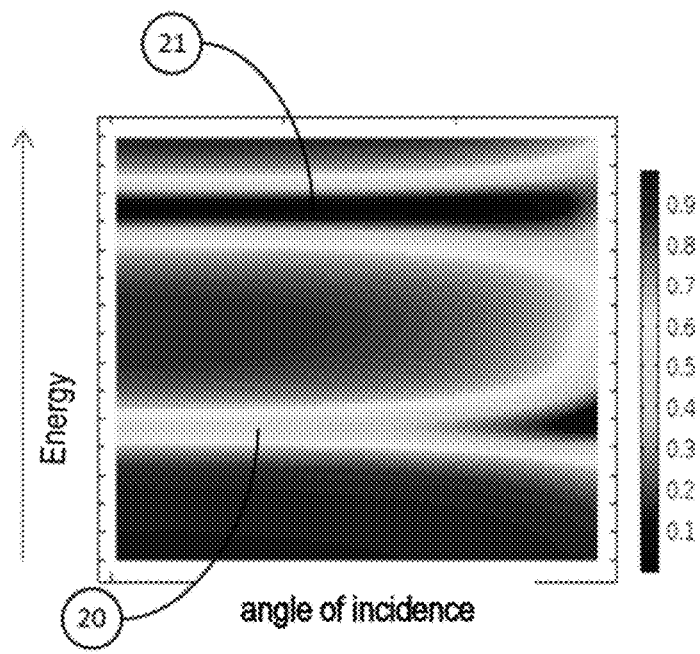
Figure 3:
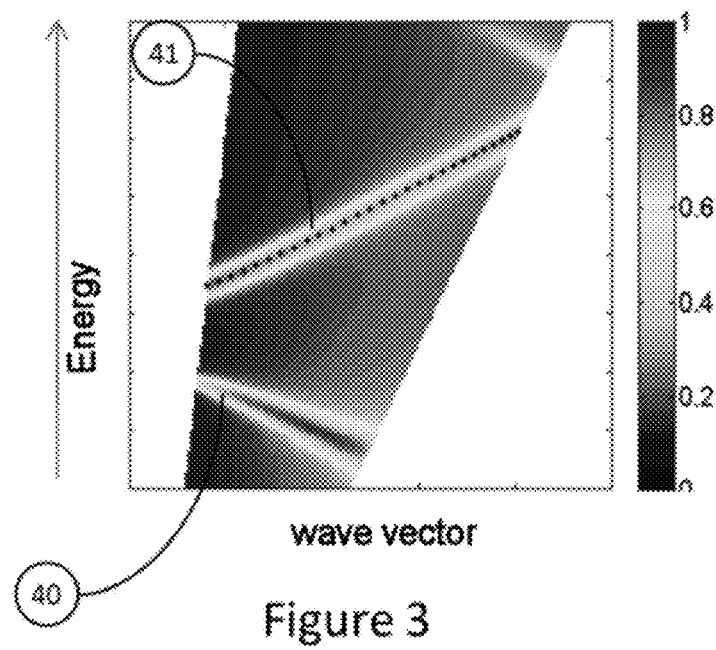
Figure 4:
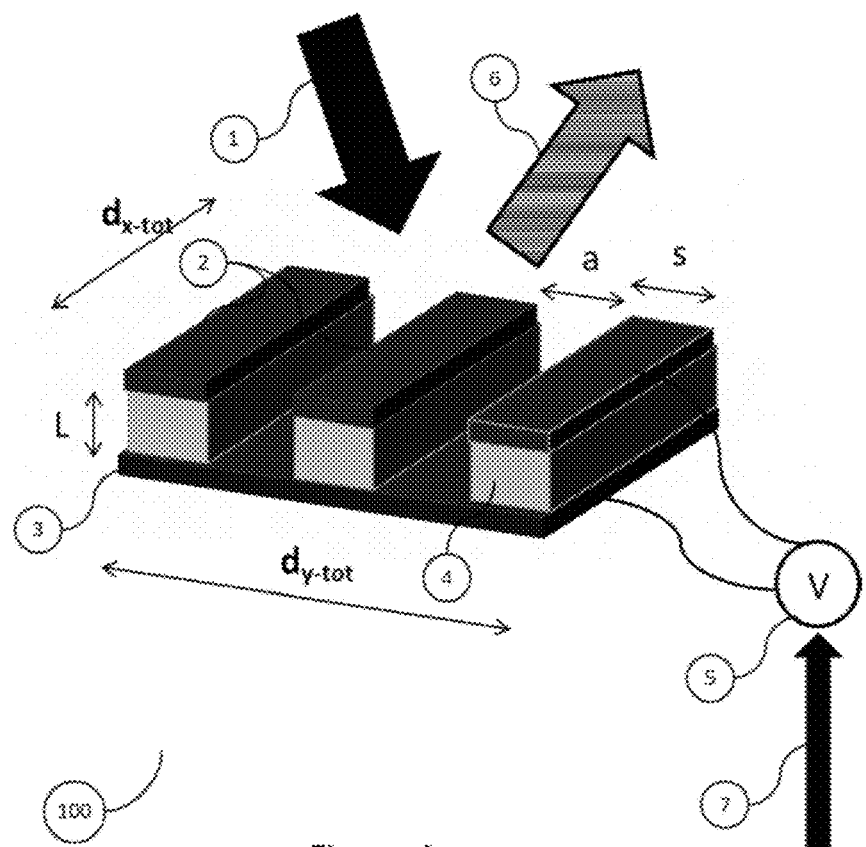
Figure 5:
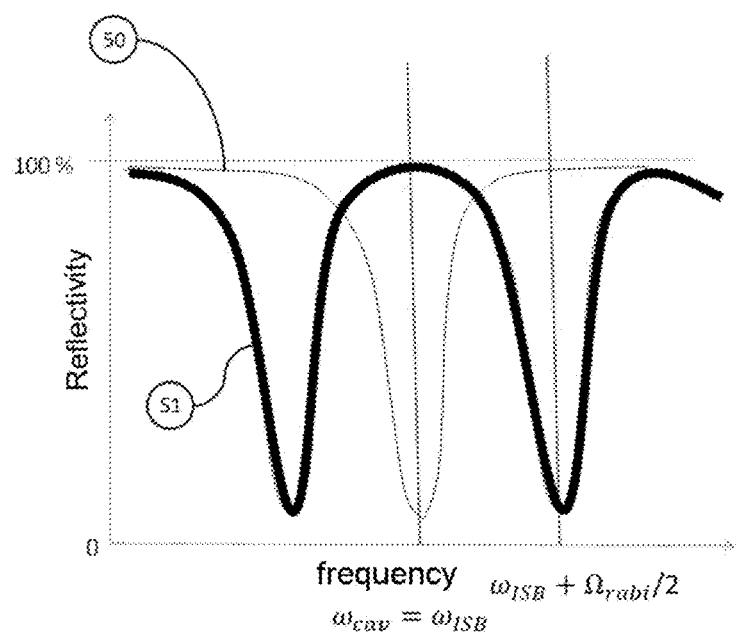
Figure 6:
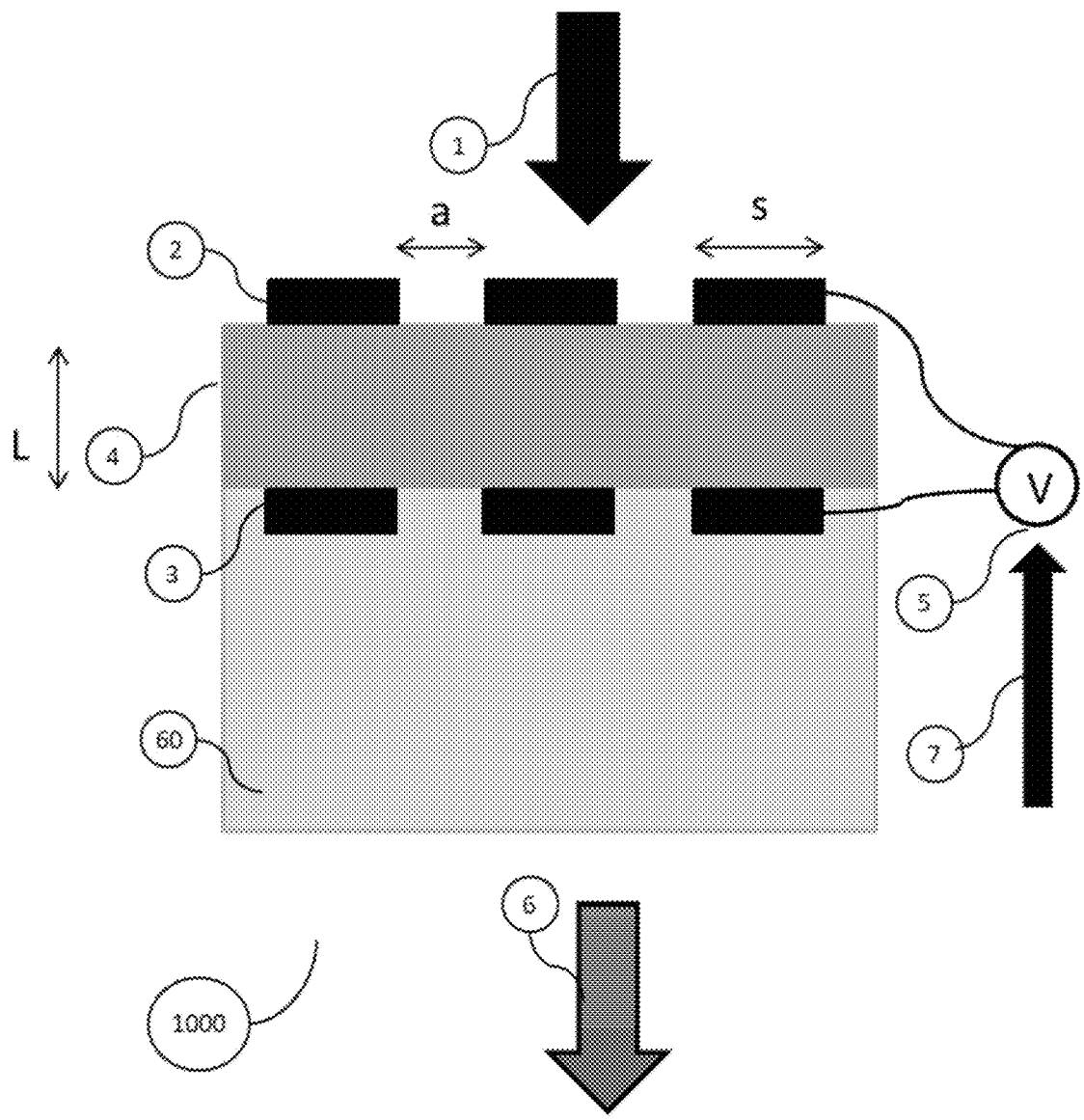
Figure 7:
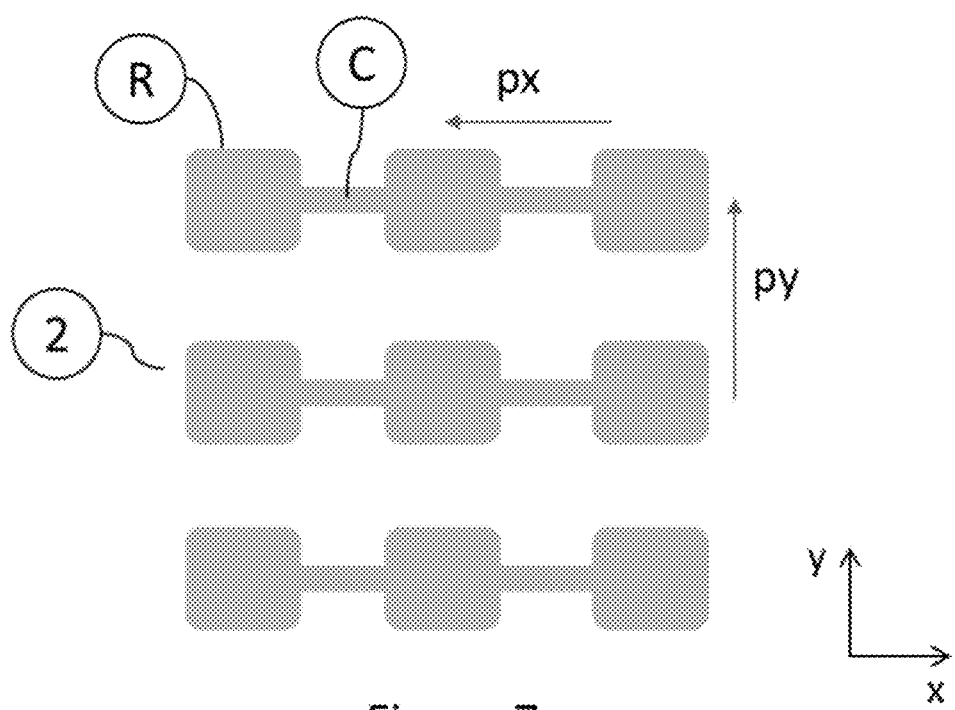
Figure 8:
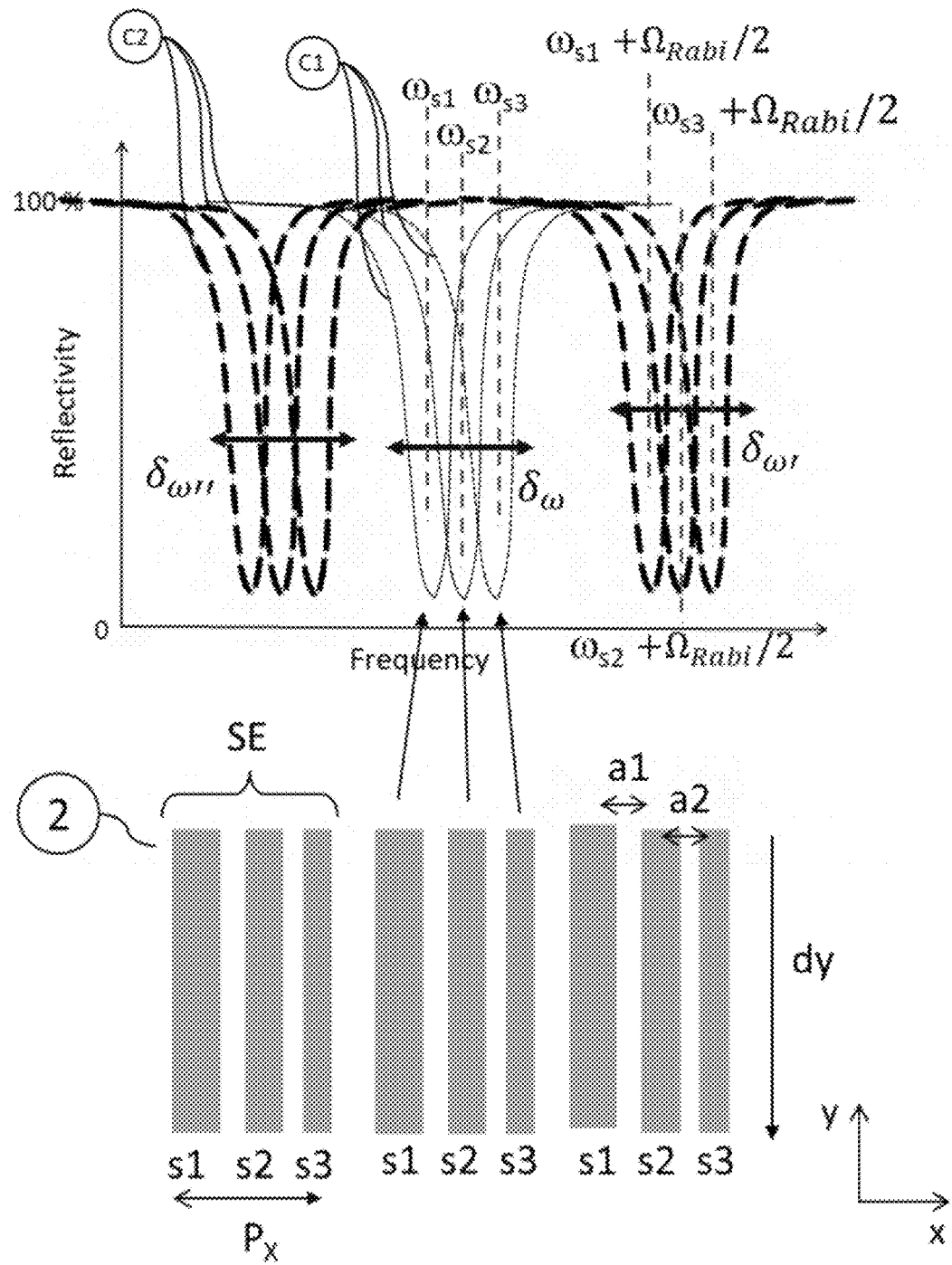
Figure 9:
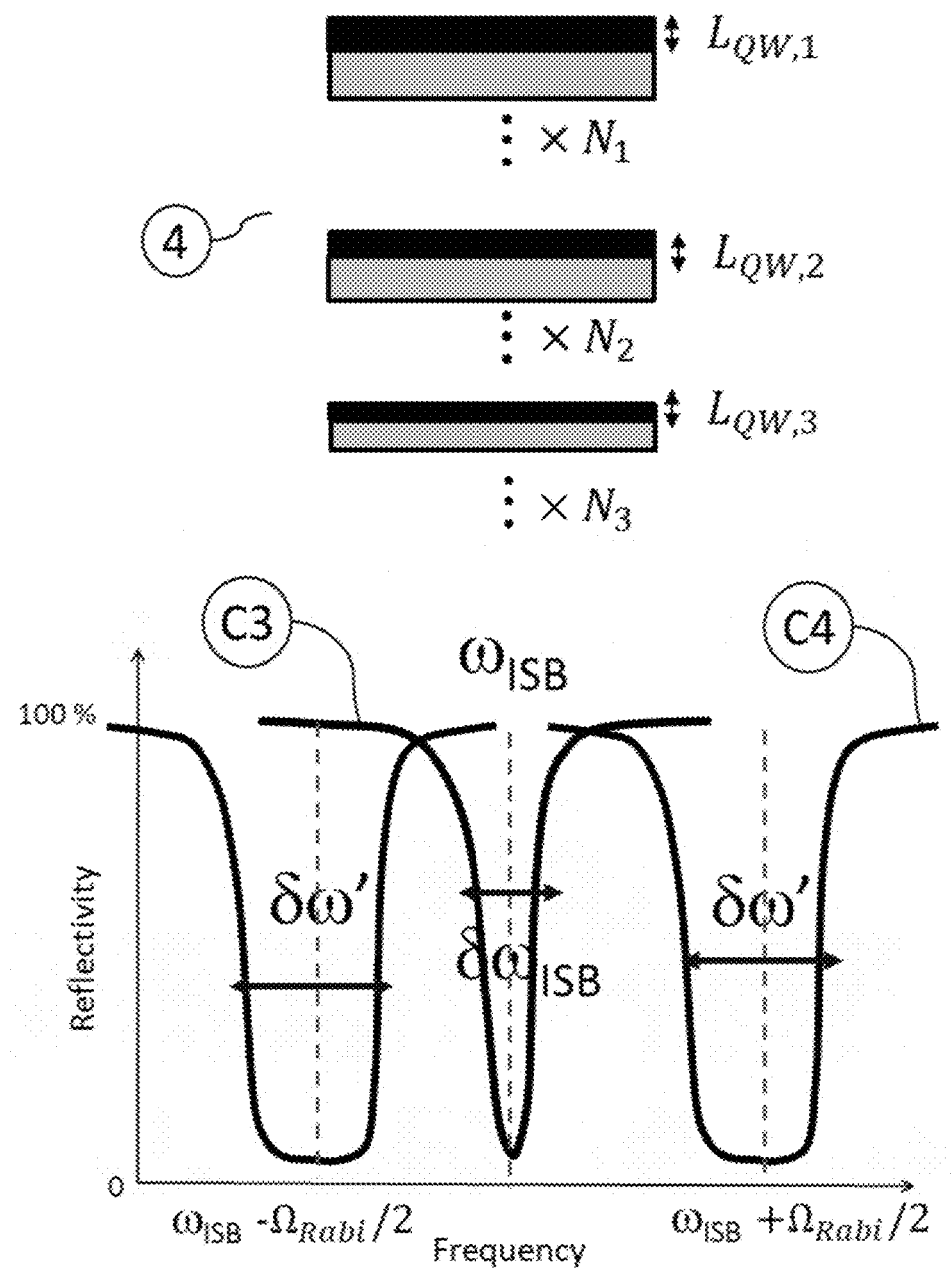

Other features, details and advantages of the invention will emerge on reading the description which is given with reference to the attached drawings given by way of example and which represent, respectively:

FIG. 1, a schematic view of an ultra-fast modulation device for modulating the amplitude of an incident laser radiation according to a first embodiment of the invention;

FIG. 2, a band diagram of the device in non-dispersive regime;

FIG. 3, a band diagram of the device in dispersive regime;

FIG. 4, a schematic view of an ultra-fast modulation device for modulating the amplitude of an incident laser radiation according to a second embodiment of the invention;

FIG. 5, the reflectivity of the devices of the invention with or without voltage applied;

FIG. 6, a schematic view of an ultra-fast modulation device for modulating the amplitude of an incident laser radiation in transmission according to a third embodiment of the invention;

FIG. 7, the metal top layer of a modulation device according to an embodiment of the invention;

FIG. 8, an illustration of a modulation device according to an embodiment of the invention;

FIG. 9, an illustration of a modulation device according to an embodiment of the invention.

DETAILED DESCRIPTION

The subject of the invention, among others, is a device composed of a semiconductive layer inserted into a microcavity that makes it possible to modulate the amplitude of an incident laser radiation by applying an external electrical field in the cavity. The light-material coupling between the microcavity and the semiconductive layer is produced in strong coupling regime.

FIG. 1 is a diagram of an ultra-fast modulation device 10 for modulating the amplitude of an incident laser radiation 1 according to a first embodiment of the invention. This device 10 operates by reflection and makes it possible to obtain a fast modulation (greater than 10 MHz) with a modulation depth exceeding 90%. In the embodiment of FIG. 1, the incident laser radiation 1, of which it is desired to modulate the amplitude, has a wavelength $\lambda_r$, with $\lambda_r \in$ [3-20 μm], thus giving a modulated laser radiation 6.

In the embodiment of FIG. 1, the laser radiation 1 is a continuous wave radiation. Alternatively, the laser radiation 1 can be a pulsed radiation.

The device 10 of FIG. 1 is composed of a first metal bottom layer 3, an intermediate semiconductive layer 4 and a metal top layer 2. The two metal layers form between 80 and 300 nm of thickness. The intermediate semiconductive layer is also called active region.

The metal bottom layer is uniform and does not have discontinuities. The metal top layer is formed by a plurality of metal strips of width s, separated by a distance a, with $s+a<\lambda_r/2$. This criterion is important because it makes it possible to avoid having the device behave as a diffraction grating and therefore presents the appearance of additional orders of diffraction in the modulation of an incident laser radiation.

In the embodiment of FIG. 1, the distance between the two metal layers or the maximum thickness of the active region L is much less than the wavelength of the incident laser radiation (L<=λ/10). Thus, the cavity formed by the two metal layers behaves as a microcavity or an optical microresonator with a single resonance mode at the wavelength λ. Hereinbelow, it is considered that the thickness of the active region and the distance between the two metal layers are equal and have the value L.

The device of FIG. 1 comprises an electric circuit 5 configured to apply, from an incident RF signal 7, a voltage difference between the two metal layers. The contacts between the intermediate semiconductive layer and the metal layers are produced by Schottky contacts by directly depositing the metal contact (e.g. titanium/gold) on the semiconductive layer, or else by the introduction of insulating layers such as SiN or SiO2 or any other insulation compatible with the fabrication of optoelectronic devices in order to avoid an excessively high current passing through the semiconductive layer. Hereinbelow, the effect of the application or non-application of a voltage difference (and therefore the creation of an electrical field) between the two metal layers will be detailed. It is simply mentioned here that it makes it possible to induce a change of the absorption of the semiconductive layer at a given wavelength.

Depending on the thickness L of the semiconductive layer, the microcavity can operate in non-dispersive or dispersive mode. In dispersive mode, the resonance frequency or frequencies of the microcavity depend on the angle of the incident radiation whereas, in non-dispersive mode, the resonance frequency or frequencies do not depend on the angle of incidence of the incident radiation. In this latter case, the resonance frequencies are set simply by the width of the metal strips s. It should be noted that L does not affect the operating wavelength of the device, but only the dispersive or non-dispersive operating regime.

In the first embodiment, the thickness L of the semiconductive layer is approximately equal to $\lambda_i/30$ in order to operate in non-dispersive mode, with $\lambda_i$ the wavelength of the incident laser radiation of which it is desired to modulate the amplitude. Thus, each metal strip belonging to the metal top layer forms, with the metal bottom layer, a "unitary" cavity, and, since the electromagnetic field is located in each unitary cavity, only below each metal strip. There is therefore no interaction between the unitary cavities because of the strong lateral containment of the resonance. In this case, the reflectivity of the device is very high. Generally, it is considered that the microresonator operates in non-dispersive regime if the thickness of the active region is equal to $\lambda_i/30$ to ±30%. Preferably, the thickness of the active region L is chosen by digital simulations of the strip structure of the resonator so as to operate in non-dispersive regime.

In the non-dispersive embodiment, the width of the strips s makes it possible to set the wavelength of use of the amplitude modulation device 10. When the semiconductive layer does not absorb the incident laser radiation, the device 10 can operate on two resonance modes $TM_{00}$ and $TM_{02}$ which correspond to two different wavelengths: $\lambda=2 \cdot n \cdot s$ and $\lambda=2 \cdot n \cdot s/3$ respectively, with n the refractive index of the semiconductive layer. Alternatively, according to another embodiment, the device 10 operates on the resonance modes $TM_{0i}$ with $i \in \mathbb{N}$, each mode corresponding to the wavelength $\lambda_i=2 \cdot n \cdot s/(i+1)$.

FIG. 2 schematically illustrates the resonance modes in the case of non-dispersive operation. It represents the reflectivity of the device of FIG. 1 as a function of the frequency and the angle of the incident laser radiation (when the intermediate semiconductive layer does not absorb the incident laser radiation). The two horizontal strips 20 and 21 correspond to the two resonance modes $TM_{00}$ and $TM_{02}$ respectively. Each resonance mode has a certain line width δE. As mentioned previously, through the small distance between the two metal layers, the frequency of the cavity resonance modes is independent of the angle of incidence of the laser radiation. For example, in the embodiment of FIG. 1, the resonance mode $TM_{00}$, at the wavelength $\lambda_{cav}=h \cdot c/E_{cav}=9.5$ µm can be used. The semiconductive layer is composed of a stack of quantum wells made of GaAs, having a refractive index n≈3.3. The width of the metal strips is then s=1.44 µm. The line width of the resonance mode has the value $\delta E_{cav}$.

After having set the wavelength of use by setting the width of the metal strips s, the separation a between the metal strips is chosen by simulation so as to be located as close as possible to the critical optical coupling. In this condition, the losses of the resonator (giving the line width of the resonance modes) are equal to the coupling ratio of the photons originating from the incident radiation, which means that all the energy of the incident radiation is absorbed. Indeed, a sets the metal strip density. In concrete terms, a is optimized with s set so as to obtain the best contrast in reflectivity as a function of the wavelength of the incident radiation. The optimization of the spacing a is done by simulation, the optimal value being able to vary according to the semiconductive active region. In the embodiment of FIG. 1, a=1.1 µm.

Alternatively, the device 10 can operate in dispersive regime. In this operating regime, the thickness of the semiconductive layer L is chosen to be approximately equal to $\lambda_i/10$. In fact, for such a thickness, the electromagnetic field is no longer located only below the metal strips of the top layer in the unitary cavities which are coupled, giving rise to the dispersive behavior. It is considered that the microresonator operates in dispersive regime if the thickness L of the active region is greater than or equal to $\lambda_i/10$. In this operating regime, the frequency of the optical modes depends on the angle of incidence.

FIG. 3 illustrates the two optical resonance modes of the device 10 when it operates in dispersive regime, that is to say when the thickness L of the active region is greater than $\lambda_i/10$. FIG. 3, just like FIG. 2 represents the reflectivity of the device 10 as a function of the frequency of the incident radiation when the intermediate semiconductive layer does not absorb the incident laser radiation. As explained previously, a dependency of the frequency of the two resonance modes 40 and 41 as a function of the wavelength is observed. The distance between the two branches is set by the ratio s/a. In concrete terms, the device 10 in dispersive regime of the embodiment of FIG. 3 has an optimal operating frequency that can be tuned as a function of the angle of incidence. However, hereinbelow, it is considered that the thickness of the active region is such that the device 10 of FIG. 1 operates in non-dispersive regime.

In another embodiment, illustrated in FIG. 4, the device 100 has a semiconductive layer 4 only included below the metal strips (in the unitary cavities). There is no semiconductive layer between the unitary cavities (between the metal strips of the metal top layer). In other words, the active region is etched in the portions of the active region that are not covered by the metal. This makes it possible to create an air/semiconductor interface between the unitary cavities and therefore obtain a better containment of the electromagnetic modes in the unitary cavities. A better coupling of the incident laser radiation in the cavity is thus obtained. In this embodiment, the thickness of the action region L is chosen so as to operate in the non-dispersive regime. The thickness of the semiconductive layer is therefore approximately equal to $\lambda_r/30$. It should be noted that, in the embodiment of FIG. 4, it is in practice difficult to obtain a dispersive operating regime.

In the embodiment of FIG. 1, the semiconductive layer is composed of 7 identical quantum wells made of GaAs of $L_{QW}$=9.5 nm wide and barriers made of $Al_{0.3}Ga_{0.7}As$ of 20 nm wide. The quantum wells have an electronic doping (of n type) of $6.10^{11}$ $cm^2$, which is introduced in delta-doping form in the $Al_{0.3}Ga_{0.7}As$ barriers. Alternatively, the doping can be introduced in the wells. The quantum wells then have an intersubband (ISB) at $$\lambda_{ISB} = h \cdot \frac{c}{E_{ISB}} = 9.5 \ \mu m$$

with a line width $$\frac{\Delta \omega}{\omega} \sim 10\%,$$

the absorption level being proportional to the doping introduced in the quantum wells. This absorption line is resonant with the mode $TM_{00}$ of the microcavity, giving rise to a strong light-material coupling that will be detailed hereinbelow. In another embodiment, the structure, the doping and the material of the quantum wells and of the barriers are chosen so that the quantum wells exhibit an intersubband energy transition $E_{ISB}$=h·c/$\lambda_{ISB}$ of line width $\delta E_{ISB}$ close to a resonance mode of the energy microcavity $E_{cav}$ of line width $\delta E_{cav}$. Close is understood to mean that $|E_{ISB} - E_{cav}| < \delta E_{cav} + \delta E_{ISB}$.

In a second embodiment, illustrated in FIG. 4, the device 100 comprises a semiconductive layer composed of a stack of a plurality of pairs of coupled quantum wells. In this embodiment, the coupled quantum wells are formed by a non-doped narrow well, called active well, and an electronically-doped wide well, called reservoir, that are separated by a first thin barrier. Each pair of coupled quantum wells is separated by a second barrier that is wider than the first. Alternatively, the electronic doping can be introduced in the first, thin barrier separating the wide well from the active well.

For example, the semiconductive layer can be composed of 5 stacks of the following structure: an active well made of GaAs of width $L_{QW}$=7.5 nm separated by a thin, 4 nm barrier made of $Al_{0.3}Ga_{0.7}As$ from a wide, 14.5 nm well of GaAS with a doping of $6·10^{11}$ $cm^{-2}$ or else $1.2·10^{12}$ $cm^{-2}$. The coupled wells being separated from one another by an 18 nm barrier of $Al_{0.3}Ga_{0.7}As$.

In this embodiment, the active wells exhibit an ISB transition at $\lambda_{ISB}$=9.5 μm of line width $\delta E_{ISB}$. However, since the charges originating from the doping are in the reservoir wells and not in the active wells, as it is, the semiconductive layer of the device 100 does not absorb at 9.5 μm.

Alternatively, the structure of the active region of the embodiment of FIG. 4 can be identical to that used in the device 10 of FIG. 1 and the structure of the active region of the embodiment of FIG. 1 can be identical to that used in the device 100 of FIG. 4.

As mentioned previously, making the quantum wells resonant microcavities modifies the interactions between the photon and the intersubband excitation, that will hereinafter be called ISB plasmon. In fact, the semiconductive microcavity makes it possible to selectively couple a single mode of the electromagnetic field of the cavity to a single ISB plasmon mode. In the embodiment of FIG. 1, it is the mode $TM_{00}$ which is coupled to the ISB transition at 9.5 μm. The element of the matrix of this light-material coupling is expressed by the quantity $\Omega_{rabi}$, called Rabi frequency. The higher the quantity $\Omega_{rabi}$, the stronger the coupling.

The following is defined:

$$E_{rabi} = \hbar \Omega_{rabi} = L_{QW,tot}/2L \times \sqrt{\frac{f_{12} \cdot n_d \cdot e^2}{\epsilon_0 \cdot \epsilon_{slab} m^* \cdot L_{QW}}} \quad \text{[Math. 1]}$$

With $L_{QW,tot}$ the total length of the wells of only the active quantum wells in the structure, L the total length of the semiconductive layer, $L_{QW}$ the length of the active quantum wells, $f_{12}$ the oscillator force of the ISB transition of the active quantum wells (determined by digital computation), $\epsilon_0$ is the dielectric constant of the vacuum, $\epsilon_{stab}$ is the dielectric constant of the active region and m* is the effective mass of the electron in the active quantum wells. Finally, $n_d$ is the surface electronic doping introduced in each quantum well, or barrier in the case of delta doping.

In the embodiment of FIG. 1, $n_d$ corresponds to the doping introduced in the $Al_{0.3}Ga_{0.7}As$ barriers, and, in the second embodiment (FIG. 4), $n_d$ corresponds to the doping introduced in the reservoir wells or in the barriers. In this embodiment, $L_{QW,tot}$=L.

In order to obtain the highest possible modulation contrast between the absorbent and non-absorbent states of the device, the latter operates in strong photon-ISB plasmon-coupling regime. In fact, under certain conditions, this coupling can become a so-called strong coupling, and new eigenmodes of the system then appear, called cavity polaritons. The line widths of the coupled cavity resonance mode and ISB transition are defined $\delta E_{cav}$ and $\delta E_{ISB}$.

When $E_{rabi} \ll \delta E_{cav}$, $\delta E_{ISB}$, the spontaneous emission is irreversible, the photon emitted upon the radiative recombination "is lost" in the cavity, the oscillator force (of the coupling) linked to $\Omega_{rabi}$ is too weak to once again allow the absorption of this photon. This is the weak coupling regime. Conversely, when $E_{rabi} \gg \delta E_{cav}$, $\delta E_{ISB}$, the emitted photon remains in the cavity for long enough to be reabsorbed: this is the strong coupling regime. There is therefore a coherent exchange of energy between the quantum well and cavity photonic mode: the phenomenon is reversible. These are the Rabi oscillations. In this regime, the eigenstates of the system are mixed photon-ISB plasmon states, called polaritons (upper polaritons and lower polaritons). In the spectral range, the Rabi oscillations are revealed by an energy separation $2·\Omega_{rabi}$, called Rabi splitting, and by the anti-crossing observed between the coupled states. In concrete terms, this strong coupling and this Rabi splitting are reflected by a splitting at the frequencies $\pm \Omega_{rabi}$ of the simple intersubband transition—isolated from any coupling—at $\omega_{ISB}=2\pi c/\lambda_{ISB}$. Conversely, a weak coupling regime between an ISB transition and a cavity resonance mode is reflected only by a widening of the resonance of the cavity.

In all the embodiments of the invention, the quantum wells and the microcavity are parameterized so as to have $\delta E_{cav}$, $\delta E_{ISB} \approx E_{ISB}/10$.

The different parameters of the structure of the semiconductive layer influencing the Rabi splitting ($L_{QW,tot}$, L, $L_{QW}$, $f_{12}$, $\epsilon_{stab}$, $n_d$) are therefore chosen appropriately for $E_{Rabi} > \delta E_{ISB}$, $\delta E_{cav}$. With $\delta E_{ISB}$, $\delta E_{cav} < E_{ISB}/10$, $E_{rabi} >> E_{ISB}/10$ is therefore desirable (see [Math.1]).

It is then understood that, without an electrical field generated between the metal layers by virtue of the electric circuit 5, the device 10 of FIG. 1 absorbs an incident laser radiation at frequencies $\omega_{ISB} \pm \pm \Omega_{rabi}$ and does not absorb at the frequency $\omega_{ISB}$ corresponding to the ISB transition of the quantum wells, close to a resonance mode of the cavity of frequency $\omega_{cav}$. In fact, the electrons are present in the quantum wells in the cavity and the strong coupling gives rise to the formation of cavity polaritons and Rabi splitting.

Likewise, without an electrical field generated between the metal layers, only a laser radiation at a frequency equal to a resonance mode of the cavity $\omega_{cav}$, is absorbed by the device 100 of FIG. 4. In fact, the electrons originating from the doping are present in the reservoir wells and not in the active quantum wells exhibiting an ISB transition at the frequency $\omega_{ISB}$ close to a resonance mode of the cavity $\omega_{cav}$. The semiconductive layer is therefore transparent to an incident laser radiation at the frequency $\omega_{cav}$, but the cavity allows a coupling (therefore an absorption) of an incident laser radiation at such a frequency. Conversely, an incident radiation having a frequency different from a resonance mode of the microcavity will be reflected by the device 100.

The electric circuit 5 is adapted to apply a voltage difference between the two metal layers.

In the embodiment of FIG. 1 and of FIG. 4, the electric circuit is configured to apply a voltage difference between the two metal layers $V_1 = F^*L$, with F the electrical field necessary to "empty" or depopulate the quantum wells of the charges originating from the doping. In fact, the application of an electrical bias allows for a rapid displacement of the charges from the quantum wells to one of the metal layers.

In the embodiment of FIG. 1, with the exemplary GaAs structure presented previously, $V_1 = 6$ V. The application of such a voltage difference will therefore make it possible to make the semiconductive layer transparent to an incident laser radiation of energy $E_{ISB} \pm \hbar \Omega_{Rabi}$ $\lambda_{ISB} \pm \Omega_{rabi}$: with the electrons no longer being present in the quantum wells, a photon at a resonance mode of the cavity is no longer coupled in strong regime, selectively, to an ISB transition of the quantum wells of the semiconductive layer, creating cavity polaritons.

Thus, upon the application of a voltage difference $V_1 = F^*L$ between the two metal layers, the device behaves as a "conventional" microcavity: the device of FIG. 1 reflects a laser radiation with an energy $E_{ISB} \pm \hbar \Omega_{Rabi}$. $\lambda_{ISB} \pm \hbar \Omega_{rabi}$. In fact, these wavelengths do not correspond to resonance modes of the cavity, so the laser radiation will not be coupled (will not therefore be absorbed) by the cavity. Conversely, the device of FIG. 1 absorbs any incident laser radiation with a wavelength corresponding to the resonance modes of the cavity.

By taking as reference an incident laser radiation at a wavelength $\lambda_i$ equal to a resonance mode of the cavity, the "absorbent" state will be used to designate the state of the device 10 corresponding to a voltage difference $V_1 = F^*L$ applied between the two metal layers and the "reflecting" state will be the state corresponding to a zero voltage difference ($V_0 = 0V$) between the two metal layers.

The use of the strong coupling regime and Rabi splitting therefore allows the device of FIG. 1 to obtain a very good modulation depth (>90%) between the absorbent state and the reflecting state.

FIG. 5 schematically illustrates the reflectivity of the device 10 as a function of the frequency of the incident laser radiation and as a function of the voltage difference applied between the metal layers. The curve 50 (thin line) represents the reflectivity of the device for the absorbent state (a voltage difference $V_1 = F^*L$ between the two metal layers). As mentioned previously, in this particular case, the charges are no longer in the quantum wells, there is therefore no Rabi splitting and the device behaves as a "conventional" microcavity: that is to say that it absorbs an incident laser radiation if its wavelength is equal to a resonance mode of the cavity.

The curve 51 (thick line) represents the reflectivity of the device for the reflecting state (a zero voltage difference between the two metal layers). In this particular case, the doping is present in the quantum wells in the cavity, which gives rise to the formation of cavity polaritons and to Rabi splitting at the frequencies $\omega_{ISB} \pm \Omega_R$ from the simple ISB transition to $\omega_{ISB}$ close to a resonance mode of the cavity at $\omega_{cav}$. This splitting provokes an absorption by the device 10 of an incident laser radiation at the energies $E_{ISB} \pm \hbar \Omega_{Rabi}$ $\lambda_{ISB} \pm \hbar \Omega_R$ and a reflection of an incident laser radiation at the wavelength $\lambda_{ISB}$.

It is important to note that, in the embodiment of FIG. 1, the distance between the two metal layers L (therefore, here, the maximum thickness of the semiconductive layer) is not only limited by the desire to operate in cavity non-dispersive regime. The thickness of the semiconductive layer is also limited by the maximum gate voltage $V_{max}$ that the Schottky contacts between the semiconductive layer and the metal layers can withstand. This means $V_1 = F^*L < V_{max} = F^*L_{max}$, which imposes an upper limit $L_{max}$ on the thickness of the semiconductive layer such that $L < L_{max}$. By using Ti/Au on non-doped GaAs contacts, it is possible to obtain a $V_{max}$ of the order of ±5 V. This value can be exceeded by using insulating layers (SiN, SiO2, Al2O3, . . . ).

The displacement of the charges provoked by the application of a voltage difference is a fast phenomenon, but limited by the time of displacement over tens or even hundreds of nanometers of the electrons from the quantum wells to one of the metal layers. Also, in the embodiment of FIG. 1, the response frequency of the device 10 remains less than a GHz. In order to enhance the response time of this embodiment, it is possible to reduce the thickness of the semiconductive layer.

This intrinsic limitation of the response time of the device 10 of the embodiment of FIG. 1 does not apply in the embodiment of FIG. 4. In fact, in the device 100, the electric circuit 5 is configured to apply a voltage difference chosen to create a bias or electrical field that makes it possible to produce a transfer by tunnel effect of the electrons introduced at the time of the doping in the reservoir wells to the active wells. This charge transfer means that the electronic doping is present in the active quantum wells in the cavity, which gives rise to the formation of the cavity polaritons and the Rabi splitting, the structure then operating in strong coupling mode. Thus, for an appropriately chosen voltage difference $V_1 \neq 0$, the device 100 of FIG. 4 absorbs an incident laser radiation at frequencies $\omega_{ISB} \pm \pm \Omega_R$ and does not absorb at the frequency $\omega_{ISB}$ corresponding to the ISB transition of the active quantum wells, close to a resonance mode of the cavity of frequency $\omega_{cav}$. By using the same reference as that of the device 10, it will be stated that it is in a reflecting state for a voltage difference between the two metal layers $V_1 \neq 0$ and in an absorbent state for $V_0 = 0V$.

FIG. 5 makes it possible to also schematically illustrate the reflectivity of the device 100 as a function of the frequency of the incident laser radiation and as a function of the voltage difference applied between the metal layers. The curve 50 represents the reflectivity of the device for the absorbent state (a zero voltage difference between the two metal layers). As mentioned previously, in this particular case, the electrons are in the reservoirs, there is therefore no Rabi splitting and the device behaves as a "conventional" microcavity: that is to say that it absorbs an incident laser radiation if its wavelength is equal to a resonance mode of the cavity.

The curve 51 represents the reflectivity of the device for the reflective state (a voltage difference $V_1 \neq 0$ between the two metal layers). In this particular case, the doping is transferred from the reservoirs to the active wells, in the cavity, which gives rise to the formation of the cavity polaritons and to the Rabi splitting at the frequencies $\omega_{ISB} \pm \pm \Omega_R$ from the simple ISB transition of the active wells at $\omega_{ISB}$ close to a resonance mode of the cavity at $W_{cav}$. This splitting provokes an absorption by the device 100 of an incident laser radiation at the energies $E_{ISB} \pm \hbar\Omega_{Rabi}$ and a reflection of an incident laser radiation at the wavelength $\lambda_{ISB}$.

Just as with the active region of FIG. 1, in the device of FIG. 3, the use of the strong coupling regime and of the Rabi splitting makes it possible to obtain a very good modulation depth (>90%) between the absorbent state and the reflecting state.

The barrier between the active wells and the reservoirs is very thin (a few nanometers), so the transfer by tunnel effect is very fast (of the order of a picosecond). Also, the response frequency of the device of FIG. 3 is very high (greater than a GHz) and only limited by the RC constant of the electric circuit.

Another advantage of the embodiment of FIG. 3 is that the voltage difference necessary to provoke the transfer of charges from the reservoirs to the active wells and therefore transition from the absorbent state to the reflecting state is lower than for the embodiment of FIG. 1. Thus, in the device 100, a voltage $V_1=2$ V is sufficient at $\lambda=9$ μm to provoke the charge transfer to the active wells. This value is much lower than needed to empty the quantum wells in the embodiment of FIG. 1 (where $V_1=6$ V) and makes it possible to ensure that $V_1<V_{max}$ does indeed apply.

Moreover, in the embodiments of FIG. 1 or 4, the total width $d_{x-tot}$ and the total length $d_{y-tot}$ of the device 100 are preferably much less than 200 μm. That makes it possible to reduce RC constant of the device. The term characteristic dimension is used to designate the greatest distance between total width $d_{x-tot}$ and total length $d_{y-tot}$.

Likewise, in all the embodiments, the contacts and microbondings are adapted so as not to limit the response time of the device.

In another embodiment, the device can be cooled to 78K using a cryostat or else with a Peltier element for example. This cooling is particularly necessary if it is desired to modulate THz waves. THz is defined as $\lambda>30$ μm.

In another embodiment, in the case of operation in non-dispersive regime, $s=3 \cdot \lambda_i/2 \cdot n$ is chosen, with $\lambda_i$ the wavelength of the incident laser radiation of which it is desired to modulate the amplitude. Thus, the resonance mode $TM_{02}$ of the cavity is used in order to increase the overlay factor between the electromagnetic mode and the semiconductive active region and thus increase the Rabi splitting of the ISB transition of the active quantum wells of frequency close to that of the $TM_{02}$ mode. That allows for a better frequency separation between the absorption line corresponding to the cavity mode $TM_{03}$ in the absorbent state and the two lines corresponding to the Rabi splitting of said ISB transition of the active quantum wells. A better modulation depth is thus obtained. Furthermore, the fabrication of the resonator is also simplified by virtue of the larger dimensions of the metal strips.

In another embodiment, the quantum wells are produced in GaAs/AlGaAs; InGaAs/AlInAs; InAs/AlSb, Si/SiGe, GaN/AlGaN or any other material that makes it possible to produce quantum wells with an ISB transition comprised between 3 μm and 200 μm.

FIG. 6 presents another embodiment of a device 1000 for modulating the amplitude of an incident laser radiation. Unlike the other embodiments of the invention, this device operates in transmission mode. For that, the metal bottom layer 3 has discontinuities and is structured in the same way as the metal top layer 2 such that the metal strips of the top and metal bottom layers are facing one another. Thus, the assembly formed by the two metal layers and the intermediate semiconductive layer constitutes a microresonator which transmits an incident radiation at a wavelength $\lambda_i$ when the semiconductive layer 3 does not absorb for this wavelength and when $\lambda_i$ does not correspond to a resonance mode of the cavity. Conversely, when the incident radiation has a wavelength $\lambda_i$ which corresponds to a resonance mode of the microcavity and the active region does not absorb at this wavelength, the incident radiation is coupled (and therefore absorbed) by the cavity. The thickness L of the active region 3 can be chosen so as to operate in dispersive or non-dispersive regime. The device comprises a substrate 8 below the metal bottom layer and in contact therewith which is a component that is transparent to the incident laser radiation. This substrate can be made of $CaF_2$, ZnSe, $BaF_2$ or any other material that is transparent to the mid-IR radiation. The fluorine-based materials ($CaF_2$, $BaF_2$) are particularly suitable because they have a low refractive index (n<1.5) in the mid-IR spectral range. In one embodiment, the substrate 8 is glued to said metal bottom layer 3. The principle of operation remains identical to the other embodiments, that is to say that, through the application of a voltage difference between the two metal layers using an electric circuit 5, an "absorbent state" can be changed to a "transmission state" (or the reverse depending on the structure of the active region) by provoking a displacement of the charges introduced by doping in the active region.

Alternatively, in the device 1000, the semiconductive layer 4 can be only included below the metal strips. There is then no semiconductive layer in the portions of the active region that are not covered by the metal. It is possible to remove the portions of desired semiconductive layer using an etching step for example. It should be noted that, in this embodiment, it is in practice difficult to operate in dispersive mode.

In another embodiment illustrated in FIG. 7, the metal top layer 2 is structured in the two directions x and y so as to form 2D resonators (or cavities) R that can be electrically connected. In this embodiment, the device operates in non-dispersive regime (L<$\lambda$/30). The structuring of the layer is adapted so as to form, with the metal layer 3 and the semiconductive layer 4, resonators of square, rectangular, triangular or other form, all identical and supporting resonant modes at the wavelength $\lambda_i$. As is known, the resonance wavelength of these resonators depends on the structuring of the layer 2 and, more specifically, on the form and the dimension of the cavities. These resonance modes can be determined digitally or—for simple geometries—analytically. The spacing px and py in the directions x and y between the resonators is preferentially chosen so as to be located as close as possible to the critical optical coupling in order to maximize the contrast of the modulator.

Preferentially, as illustrated in FIG. 7, each resonator is connected to an adjacent resonator in the direction x by metal connections C of a width very much smaller than the dimensions of the resonator, to reduce the disturbance on the electromagnetic modes. More specifically, the connections are of a width of between 1/5 and 1/20 of the characteristic dimension of the cavity (diagonal for a rectangular cavity, side for a square cavity and diameter for a circular cavity). Alternatively, according to another embodiment, each resonator is connected to an adjacent resonator by connections in the direction x and/or in the direction y.

The active region 4 can be etched or not in the regions not covered by the layer 2.

This embodiment allows for a reduction of the RC constant of the device by the reduction of the surface of the metal layer 2 and therefore allows for an increase in the modulation speed.

In another embodiment illustrated in FIG. 8, the metal top layer 2 is structured so as to allow an operation of the modulation over a widened spectral band. In this embodiment, the device operates in non-dispersive regime (L<$\lambda$/30). The top layer 2 is structured so as to be composed of a plurality of identical subsets SE comprising a plurality of metal strips of a width $s_i$, different from the other strips of the subset. Each strip is separated from an adjacent strip by a distance $a_i$ in the direction x. The subset is repeated with periodicity Px in the direction x. In the example of FIG. 8, as a nonlimiting example, each subset comprises 3 strips. Alternatively, according to another embodiment, each subset comprises at least two strips. Each metal strip of width $s_i$ of the subset forms a semiconductive cavity with the layer 4 and the layer 3 with which there is an associated absorption with or without bias centered at frequencies ($\omega_{s_i}$ and $\omega_{s_i}+\Omega_{rabi}/2$) different from those associated with the other strips.

FIG. 8 at the top presents the reflectivity of the device as a function of the frequency of the incident radiation with or without voltage difference applied. With zero bias (voltage difference $V_0$=0V), the absorption of the device corresponding to the sum of the curves C1, each associated with a strip of the subset SE, is maximal over a widened spectral band $\delta\omega$ associated with the absorption of the semiconductive cavity alone. The absorption can be adjusted/maximized by digital simulations by varying the parameters $a_i$ and $s_i$ as well as the thickness L of the semiconductive layer 4.

The width of the widened spectral band $\delta\omega$ is approximately $|\omega_{s-max}-\omega_{s-min}|$, with $\omega_{s\_min}$, and $\omega_{s\_max}$ the resonance frequencies associated respectively with the metal strips of maximum width ($s_{max}$) and minimum width ($s_{min}$).

Likewise, for a positive bias (voltage difference $V_1\neq$0V), as explained previously, the absorption of the device corresponding to the sum of the curves C2, each associated with a strip of the subset SE, is maximal over the widened spectral bands $\delta\omega'$ and $\delta\omega''$ associated with absorption of the quantum wells and the excitation of polaritons.

Because of the dependency of the polaritonic excitation frequency as a function of the resonance frequency of the cavity (linked at the width $s_i$ of the strips), $\delta\omega''<\delta\omega'<\delta\omega$.

This embodiment allows for wideband operation on the modulation device because it is absorbent over a widened range of frequencies $\delta\omega$ for a zero voltage difference and over a widened range of frequencies $\delta\omega''$ and $\delta\omega'$ for a positive voltage difference.

Alternatively, in another embodiment, the metal top layer 2 is structured in both directions x and y, in a way similar to the embodiment illustrated in FIG. 8, thus forming 2D resonators (patch cavity). In this embodiment, each patch cavity absorbs at a different frequency $\omega_{patch\_i}$ which depends on its form and dimension, which is therefore different from the other patch cavities. The result is—as in the embodiment illustrated in FIG. 8 in which the structuring is produced only in the direction y—that the modulator operates over a widened frequency range.

In another embodiment, the semiconductive layer 4 comprises a stack of a plurality of quantum wells with a thickness $L_{QW,i}$ of quantum wells different for each period i, thus constituting a stack of $N_{tot}$ periods. As a nonlimiting example illustrated in FIG. 9 at the top, there are 3 different thicknesses of quantum wells $L_{QW,1}$, $L_{QW,2}$ and $L_{QW,3}$. Thus, $N_1+N_2+N_3=N_{tot}$ periods, in which $N_i$ is the number of quantum well stacking periods of each of the i periods which give rise to an intersubband absorption at the frequency $\omega_{ISB,i}$, different for each period i. In this case, the doping in the quantum wells will have to be multiplied by 3 to obtain an absorption at the Rabi frequency $\Omega_{Rabi}$ equal to that which would have been obtained with a quantum well stack of a single thickness. Alternatively, in another embodiment, a number other than three different thicknesses will be able to be used. In the embodiment of FIG. 9 at the top, a single quantum well is used for each period. Alternatively, in another embodiment, the quantum wells of each period are coupled wells, as in the embodiment of FIG. 4.

FIG. 9 at the bottom presents the reflectivity of the device as a function of the frequency of the incident radiation with or without voltage difference applied.

With zero bias (voltage difference $V_0$=0V), the reflectivity of the device (curve C3) is maximal at the frequency of the cavity $\omega_{cav}$ associated with the absorption of the semiconductive cavity alone. The spectral width of the absorption $\delta\omega_{ISB}$ is, here, only linked to the line width of the resonance mode $\beta E_{cav}$.

For a positive bias (voltage difference $V_1\neq$0V), the reflectivity of the device (curve C4) of the device is maximal over two widened ranges of width $\delta\omega'$, at approximately $\omega_{cav}\pm\Omega_{Rabi}$, because of the plurality of intersubband absorption frequencies $\omega_{ISB,i}$ associated with each period i.

The invention claimed is:

1. A device for modulating the amplitude of an incident laser radiation on said device and having a wavelength $\lambda_i$, wherein the device comprises: a metal bottom layer above which there is a semiconductive layer which contains a stack of a plurality of quantum wells, above which there is a structured metal top layer, the two metal layers being reflective to the incident laser radiation, the structuring of the top layer and the distance between said two metal layers L-being small enough for the device to form an optical microcavity having at least one resonance mode;
at least a part of the quantum wells, called active wells, having an intersubband absorption at a central wavelength $\lambda_{ISB}$=hc/$E_{ISB}$, the coupling between said intersubband transition at said central wavelength $\lambda_{ISB}$ and one of the modes of the microcavity driving the excitation of cavity polaritons and a Rabi splitting at the energies $E_{ISB}\pm\hbar\Omega_{Rabi}$ with $\Omega_{Rabi}$ the Rabi frequency;
said device comprising an electric circuit configured to apply two distinct voltage differences, $V_0$ and $V_1$, between the two metal layers, the device absorbing the incident radiation for the voltage difference $V_0$ and the device reflecting or transmitting the incident radiation for the voltage difference $V_1$.

2. The device as claimed in claim 1, wherein the metal bottom layer does not have discontinuities and the device reflects the incident radiation for the voltage difference $V_1$.

3. The device as claimed in claim 1, wherein said metal top layer is formed by a plurality of metal strips of width s, separated by a distance a, with s+a<$\lambda_i$/2.

4. The device as claimed in claim 3, wherein the width of the metal strips s is such that s=$\lambda_i$/2·n to ±30% with n the index of said semiconductive layer.

5. The device as claimed in claim 3, wherein the width of the metal strips s=$\lambda_i$/2·ns is such that s=3·$\lambda_i$/2·n to ±30% with n the index of said semiconductive layer.

6. The device as claimed in claim 1, wherein the contacts between the semiconductive layer and the metal layers are produced by Schottky contacts or by the introduction of insulating layers.

7. The device as claimed in claim 6, wherein the distance between said two metal layers is equal to $\lambda_i$/30 to ±30%.

8. The device as claimed in claim 7, wherein the distance between the two metal layers is chosen by digital simulations so that said device operates in non-dispersive regime.

9. The device as claimed in claim 8, wherein the quantum wells or the barriers separating the quantum wells are electronically doped, the quantum wells being chosen so that, for a first voltage difference $V_0$ applied by said electric circuit between said two metal layers, the device exhibits an absorption to the energies $E_{ISB} \pm \hbar\Omega_{Rabi}$ and not to the wavelengths equal to the resonance modes of the cavity and so that, for a second voltage difference $V_1$, all the quantum wells of the semiconductive layer are depopulated of their charges, the device exhibits an absorption to the cavity resonance modes and not to the energies $E_{ISB} \pm \hbar\Omega_{Rabi}$.

10. The device as claimed in claim 9, wherein the thickness of the semiconductive layer is such that $V_1$ is less than the maximum voltage supported by the contacts between the semiconductive layer and the metal layers.

11. The device as claimed in claim 10, wherein the thickness of the semiconductive layer is chosen so that $V_1$ is less than 10V.

12. The device as claimed in claim 1, wherein the distance between said two metal layers is equal to $\lambda_i$/10 to ±30%.

13. The device as claimed in claim 1, wherein the semiconductive layer comprises a stack of coupled quantum wells composed of a non-doped narrow well, called active well, separated by a first barrier from a wide well, called reservoir, the coupled quantum wells being separated from one another on another side a second barrier wider than said first barrier, the first barrier or the reservoir of each coupled quantum well being electronically doped, the active wells being chosen in order for them to exhibit an intersubband absorption at a central wavelength $\lambda_{ISB}$ close to a resonance mode of said optical microcavity;

said coupled quantum wells being adapted so that, for a first voltage difference $V_0$ applied by said electric circuit between said two metal layers, the charges originating from the doping are transferred by tunnel effect into the narrow wells and the device exhibits an absorption to the energies $E_{ISB} \pm \hbar\Omega_{Rabi}$ and not to the wavelengths equal to the resonance modes of the cavity, and so that, for a second voltage difference $V_1$, the device exhibits an absorption to the wavelengths equal to the resonance modes of the cavity and not to the energies $E_{ISB} \pm \hbar\Omega_{Rabi}$.

14. The device as claimed in claim 13, wherein the thickness of the semiconductive layer is chosen so that $V_0$ is less than or equal to 2V.

15. The device as claimed in claim 2, wherein the semiconductive layer is structured so that the stacks of quantum wells are situated only directly below the metal strips of the metal top layer.

16. The device as claimed in claim 1, wherein the quantum wells of the semiconductive layer are produced in GaAs/AlGaAs; InGaAs/AlInAs; InAs/AlSb, Si/SiGe, GaN/AlGaN.

17. The device as claimed in claim 1, wherein a characteristic dimension of the device is less than 200 μm.

18. The device as claimed in claim 3, wherein the metal bottom layer has discontinuities and is structured so that said device transmits the incident radiation for the voltage difference $V_1$, said device comprising a substrate that is transparent to the incident radiation below the metal bottom layer and in contact therewith.

* * * * *